(12) United States Patent  
Anthony et al.

(10) Patent No.: US 7,705,762 B2  
(45) Date of Patent: *Apr. 27, 2010

(54) VOLTAGE RANDOM ACCESS MEMORY (VRAM)

(75) Inventors: Michael P. Anthony, Andover, MA (US); Lawrence J. Kushner, Andover, MA (US)

(73) Assignee: Kenet Incorporated, Wuborn, MA (US)

(*) Notice: Subject to any disclaimer, the term of this patent is extended or adjusted under 35 U.S.C. 154(b) by 0 days.

This patent is subject to a terminal disclaimer.

(21) Appl. No.: 12/332,168

(22) Filed: Dec. 10, 2008

(65) Prior Publication Data

US 2009/0085787 A1    Apr. 2, 2009

Related U.S. Application Data

(63) Continuation of application No. 11/649,704, filed on Jan. 4, 2007, now abandoned, which is a continuation-in-part of application No. PCT/US2005/024137, filed on Jul. 6, 2005.

(60) Provisional application No. 60/585,610, filed on Jul. 6, 2004.

(51) Int. Cl.  
    *H03M 1/12*    (2006.01)

(52) U.S. Cl. .................. 341/155; 341/154; 365/154

(58) Field of Classification Search .............. 341/154, 341/155; 365/154, 173, 209, 158  
See application file for complete search history.

(56) References Cited

U.S. PATENT DOCUMENTS

| 5,744,659 | A  | * | 4/1998 | Tsuda et al. | 570/167 |
| 6,341,084 | B2 | * | 1/2002 | Numata et al. | 365/158 |
| 6,587,371 | B1 | * | 7/2003 | Hidaka | 365/173 |
| 6,754,123 | B2 | * | 6/2004 | Perner et al. | 365/209 |

* cited by examiner

*Primary Examiner*—Jean B Jeanglaude  
(74) *Attorney, Agent, or Firm*—Hamilton, Brook, Smith & Reynolds, P.C.

(57) ABSTRACT

An integrated circuit memory cell and voltage ladder design that adapts techniques typically applied to Static Random Access Memory (SRAM) circuits to implement a compact array of analog Voltage Random Access Memory (VRAM) locations. The memory cells in the VRAM each store a digital value that controls a corresponding switch. The switch couple a particular voltage from a set of voltages generated by the ladder, to be output when that location is enabled. Multiple analog output voltages are provided by simply providing additional rows of cells.

20 Claims, 9 Drawing Sheets

DC OPERATING POINT:

C {
- V(ladder_0) = 1.3 V  ← BOTTOM OF LADDER
- V(ladder_1) = 1.325 V
- V(ladder_2) = 1.35 V
- V(ladder_3) = 1.375 V
- V(ladder_4) = 1.4 V
- V(ladder_5) = 1.425 V
- V(ladder_6) = 1.45 V
- V(ladder_7) = 1.475 V F {
- V(ladder_8) = 1.475 V
- V(ladder_9) = 1.47812
- V(ladder_10) = 1.48125 V
- V(ladder_11) = 1.48437 V
- V(ladder_12) = 1.4875 V
- V(ladder_13) = 1.49062 V
- V(ladder_14) = 1.49375 V
- V(ladder_15) = 1.49687 V
- V(ladder_16) = 1.5 V
- V(ladder_17) = 1.50312 V
- V(ladder_18) = 1.50625 V
- V(ladder_19) = 1.50937 V
- V(ladder_20) = 1.5125 V
- V(ladder_21) = 1.51562 V
- V(ladder_22) = 1.51875 V
- V(ladder_23) = 1.52187 V
} FINE C {
- V(ladder_24) = 1.5 V
- V(ladder_25) = 1.525 V
- V(ladder_26) = 1.55 V
- V(ladder_27) = 1.575 V
- V(ladder_28) = 1.6 V
- V(ladder_29) = 1.625 V
- V(ladder_30) = 1.65 V
- V(ladder_31) = 1.675 V  ← TOP OF LADDER

FIG. 6

VOLTAGE RANDOM ACCESS MEMORY (VRAM)

RELATED APPLICATION(S)

This application is a continuation of U.S. application Ser. No. 11/649,704, filed Jan. 4, 2007, now abandoned which is a continuation in part of and claims priority to International Application No. PCT/US2005/024137 under 35 U.S.C. §120, which designated the United States and was filed on Jul. 6, 2005, published in English, which claims the benefit of U.S. Provisional Application No. 60/585,610, filed on Jul. 6, 2004. The entire teachings of the above applications are incorporated herein by reference.

BACKGROUND OF THE INVENTION

Several different types of circuits require the generation of multiple analog output voltages in accordance with digital input signals. In such circuits it has been customary to implement this function using a separate digital to analog converter for each required output voltage.

This approach is adequate when only a few analog voltages must be generated. However, certain types of circuits, such as charge to digital converters, may require generation of many such analog voltages. Even if integrated circuits are used to implement such circuits, the voltage generating function can occupy much space in a design.

SUMMARY OF THE INVENTION

The present invention is an integrated circuit memory cell and voltage ladder design to implement a compact array of digital to analog converters. The invention, in effect, provides an analog Voltage Random Access Memory (VRAM).

The VRAM allows storing a digital value in a memory location. A resistor ladder network and a compact array of switchable memory cells provide the set of output reference voltages. The compact array of switchable memory cells are arranged to store digital bits, which are individually addressable by row and column address decoders, in much the same way as a Static Random Access Memory (SRAM) memory circuit. However, each stored bit in a memory cell is also connected to control the state of a corresponding switch. In a preferred embodiment, each switch is coupled to a pre-selected point in the resistor ladder network.

By writing the bits in the memory cells accordingly, the switches are thereby controlled to determine which of many possible resistances in the ladder network will be selected to produce one or more output voltages.

The ladder can include a set of resistors connected in simple series to provide a set of selectable, coarse resistances.

However, in a preferred embodiment, one or more fine resistance steps can also be provided by one or more resistors arranged in parallel with one or more of the coarse resistors.

The VRAM thus provides a large number of adjustable analog voltages under control of digital inputs. This function is provided in a compact form factor that is a form factor that can be as almost as compact as standard random access memory circuitry. The equivalent functionality to a large number of latched digital analog converters is provided by requiring much less physical area and power consumption as a result.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 6 is a chart listing the output voltages that can be selected with the resistor ladder of FIG. 5.

DETAILED DESCRIPTION OF THE INVENTION

A description of preferred embodiments of the invention follows.

Figure 1:
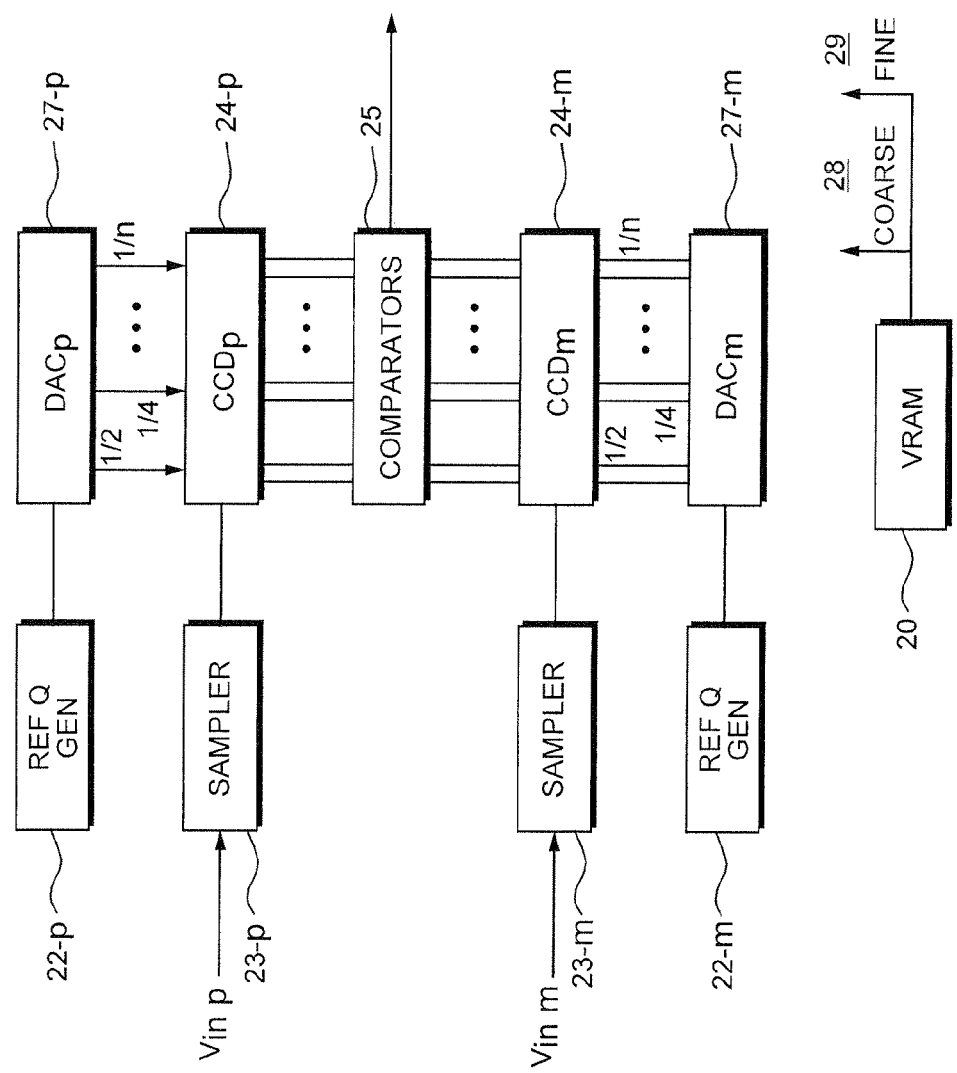
FIG. 1 is a block diagram of a circuit function, such as a charge to digital converter, that may use a Voltage Random Access Memory (VRAM) according to the present invention.

FIG. 1 is a block diagram of a device 10 that may use a Voltage Random Access Memory (VRAM) 20 according to the present invention. The illustrated device 10 is arranged as a Charge to Digital Converter (QDC). It should be understood, however, that the VRAM 20 can be used in any other application circuit where multiple analog voltages must be produced in parallel from digital inputs.

This particular QDC 10 is a so-called successive approximation type converter that uses a number of charge storage stages arranged as a serial pipeline register. In the illustrated circuit there are actually two pipelines 24-$p$, 24-$m$ (a "plus" pipeline and a "minus" pipeline") that carry charges as complimentary charge pairs. A reference charge generator 22-$p$, 22-$m$, input sampler 23-$p$, 23-$m$, and digital to analog converter (DAC) 27-$p$, 27-$m$ are associated with each serial pipeline register 24-$p$, 24-$m$. A reference charge generator and a charge splitter at each stage generate reference signals which are then optionally added to the charge as it travels down the pipeline. An array of comparators 25 produce the conversion result as a series of digital bits. The QDC 10 is implemented similar to the one described in U.S. Pat. No. 5,579,007 issued to Paul.

Of particular interest to the present invention is the VRAM 20 that can be used to generate a number of offset and adjustment voltage levels used by various components of QDC 10. The VRAM 20 can be arranged to provide coarse output 28 or fine outputs 29, or a combination thereof, in a manner that will be described in more detail below. The resulting reference voltages produced by VRAM 20, for example, are used to calibrate the DACs 27, to provide biasing points for splitter circuits, to provide reference charges to the comparators 25, or for other purposes.

Figure 2A:
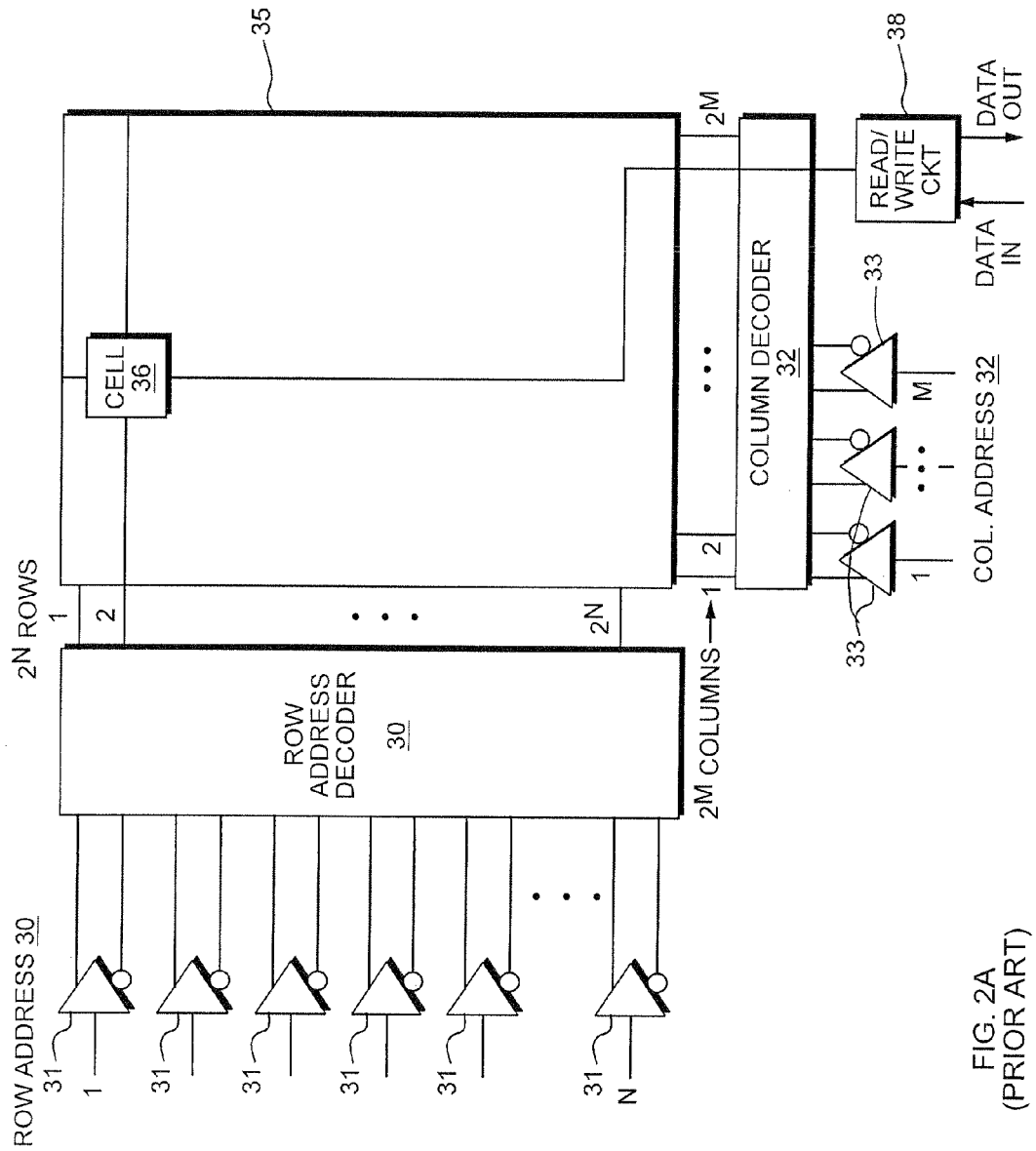
FIG. 2A and FIG. 2B show a prior art arrangement for a Static Random Access Memory (SRAM).

The approach for implementing the digital bit storage portion of the VRAM 20 is similar to a Static Random Access Memory (SRAM) type circuits. As shown in FIG. 2A, as is well known in the art, an SRAM consist of a row address decoder 30, a column address decoder 32, and associated drivers 31, 33, to address an array 35 of memory cells 36. The row 30 and column 32 decoders provide access to a particular cell 36 to allow a read/write circuit 38 to either read data to the cell 36 through a "data in" connection or read data from the cell 36 through a "data out" connection.

Figure 2B:
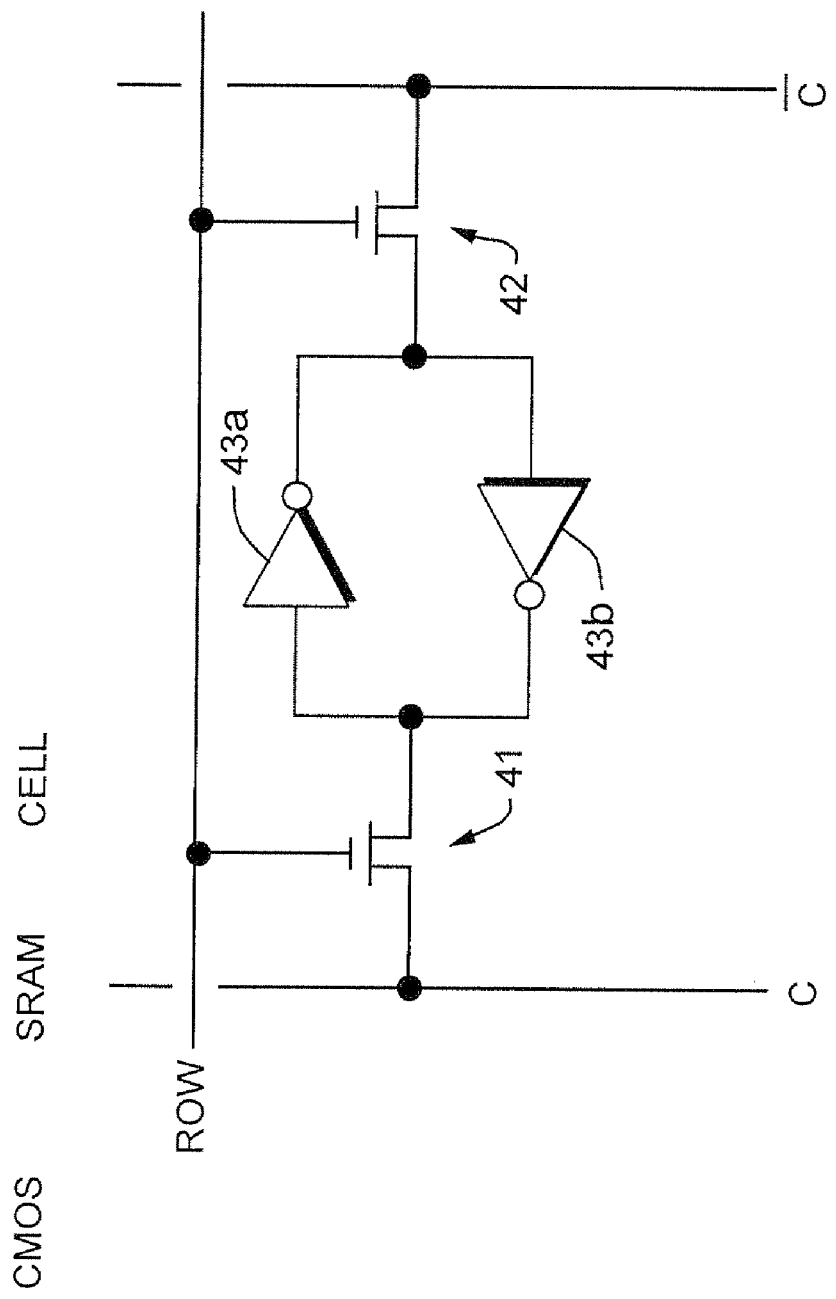

A detailed view of a typical Complementary Metal Oxide Semiconductor (CMOS) SRAM cell 36 is shown in FIG. 2B. The row address enable line (from the left hand side of the figure) and column address enable lines (from the bottom of the figure) are input to the cell 36. The cell 36 consists of an input gate 41 and output gate 42, together with a circuit capable of storing a single bit of information, such as the illustrated pair of cross-coupled inverters 43a, 43b. The cell is enabled for reading or writing by strobing its associated row and column select lines.

Figure 3:
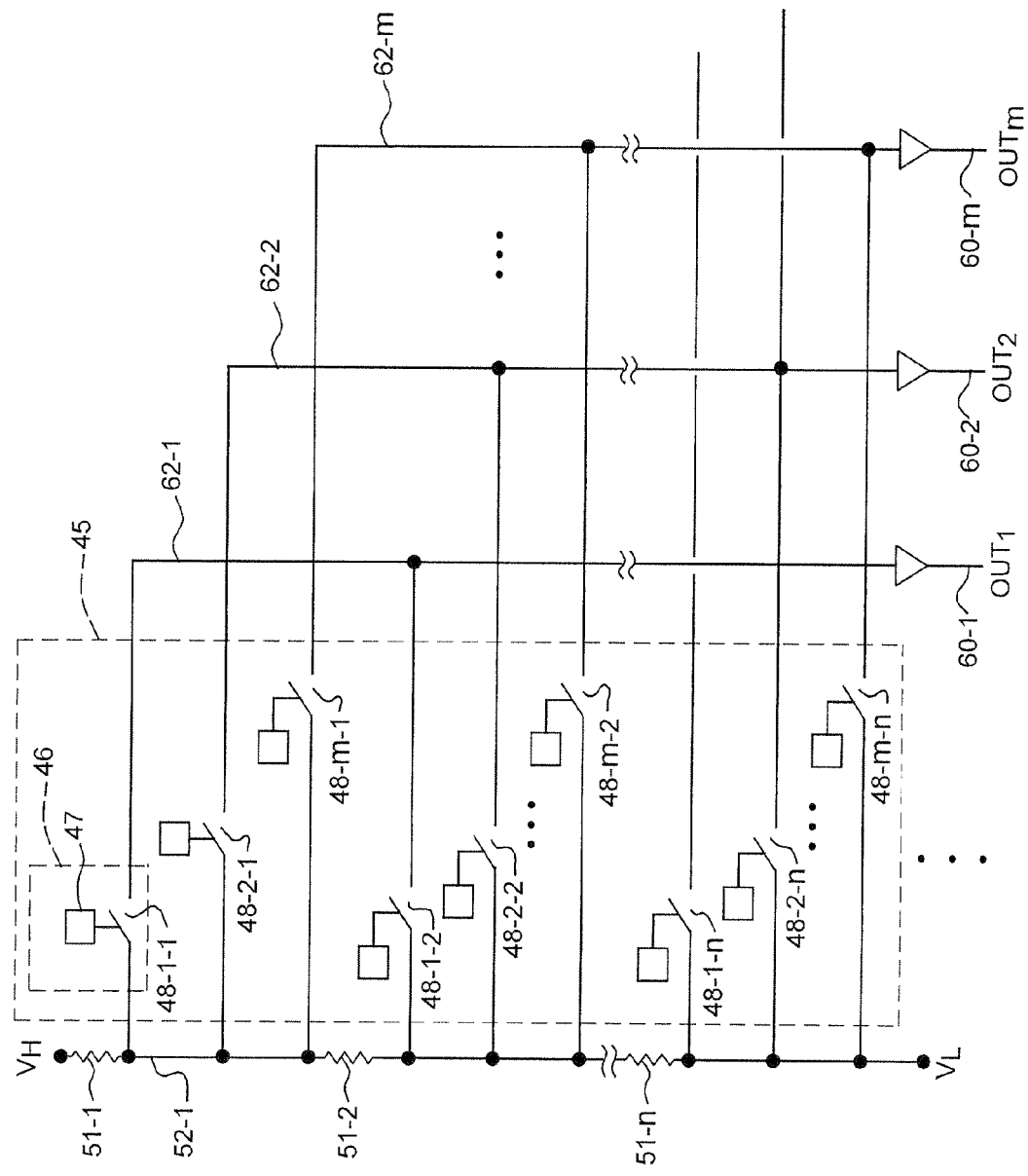
FIG. 3 shows an array of VRAM cells and a resistor ladder arranged according to the present invention.

FIG. 3 shows a more detailed view of a VRAM 20 according to the present invention. The VRAM includes a resistor array 50 and a compact storage array 46 of memory cells 46. The compact storage array in the VRAM 20 is generally similar to that in an SRAM, to the extent that it includes a array 45 of memory cells 46. However, each memory cell 46 in the VRAM contains not only a storage bit portion 47 but also a voltage switch 48.

Each voltage or "cross point" switch 48 has an input terminal that is coupled to a respective portion of the resister ladder 50. The resistor ladder 50 itself consists of a number of resistances 51-1, 51-2, . . . 51-n connected between a high voltage reference $V_h$ and a low voltage reference $V_1$. Although resistances 51-1, 51-2, . . . 51-n are shown in a series configuration in FIG. 3, it should be understood that is only one possible configuration, and that other configurations of resistors in parallel and series are possible.

The data bits stored in the memory cells 46 control the state of the switches 48. This permits any connection of resistances in the ladder 50 to be used in providing the output on a respective column line 60. In other words, a selected voltage level between Vh and V1 can be provided at any output 60 by activating the corresponding switch 48, as determined by the data stored in the corresponding cell 46.

The memory cells are preferably arranged in groups; there typically will be multiple memory cells 46 associated with each particular node 52 in the resistor ladder.

Furthermore, the output side of the n switches 48 at each step of the ladder are connected together to provide a respective one of the outputs 60-1, 60-2, . . . 60-m on a respective VRAM output column line 62-1, 62-2, . . . 62-m ($OUT_1$, $OUT_2$, . . . $OUT_m$). For example, a representative column line 62-2 connects the output of switches 48-2-1, 48-2-2, . . . , 48-2-n to produce output $OUT_2$. The voltage provided at a given output column line 62-k thus depends upon which one of the corresponding switches 48-k-1, 48-k-2, . . . , 48-k-n are closed to connect to a point in ladder 50. Thus, only a single voltage is picked from ladder 50 for each output line 62.

The available accuracy of this technique is limited only by the number of resistors 51 in the ladder 50. In one preferred embodiment there are thirty-two (32) such resistors 51, as will be discussed in connection with FIG. 5.

Figure 4:
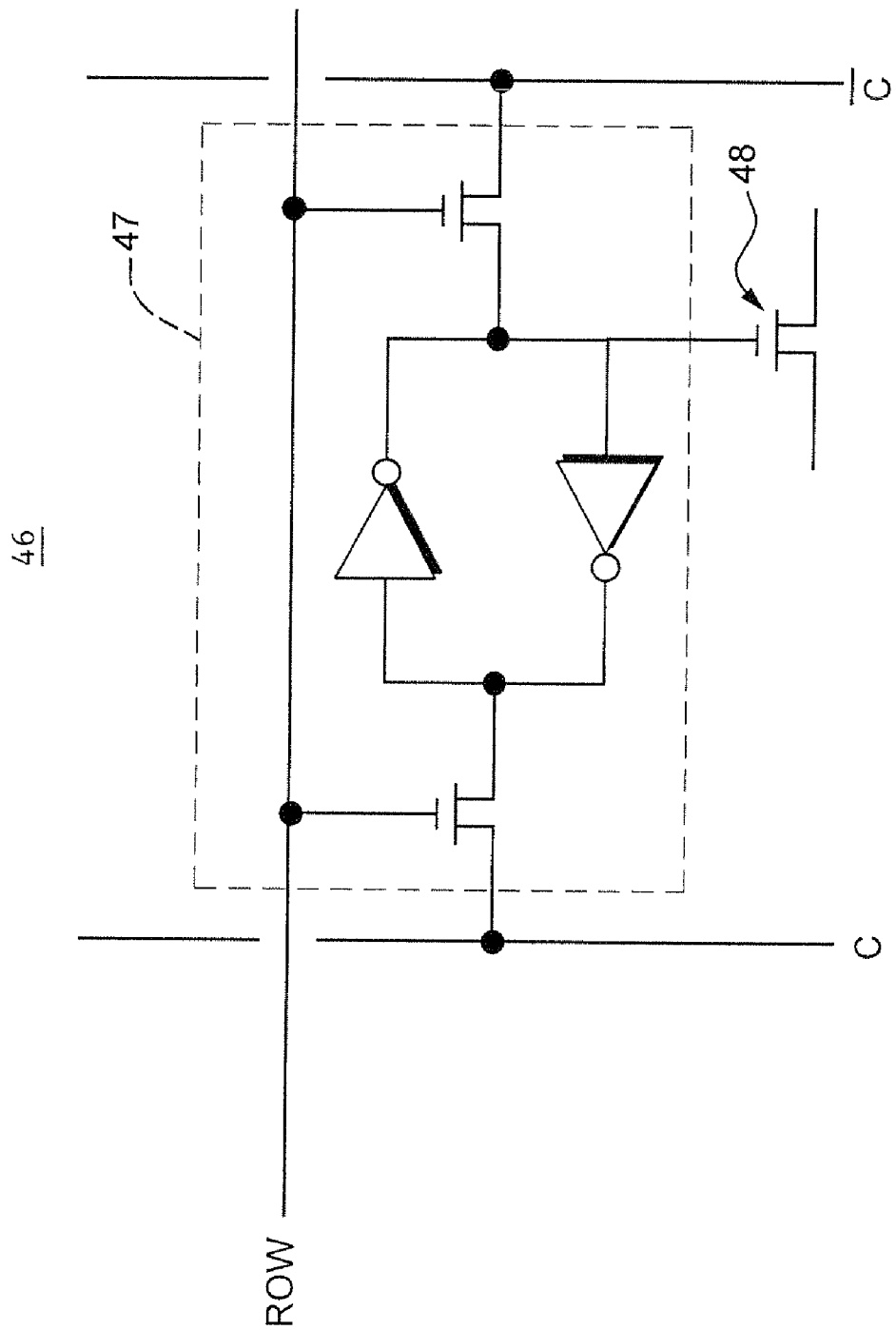
FIG. 4 is a more detailed view of a VRAM cell, showing the memory bit storage circuit and the associated switch.

FIG. 4 shows a more detailed view of one of the cells 46 of the VRAM 20. The latch or storage bit 47 portion of the VRAM is used to store a data bit in much the same way as a memory cell in the SRAM. Not shown in FIG. 4, although present, are the row and address decoder circuits that allow access to each cell for addressing and storing information in each latch 47. These circuits are the same as for the SRAM.

In addition each cell 46 also has a switch 48, which corresponds to the switches 48 shown in FIG. 3 that are coupled to steps of the ladder 50. Thus by adding the a switch 48 to each of the basic memory cells 46, there is provided a compact storage array which can be used to store information needed to produce a large number of selectable analog output voltages.

Figure 5:
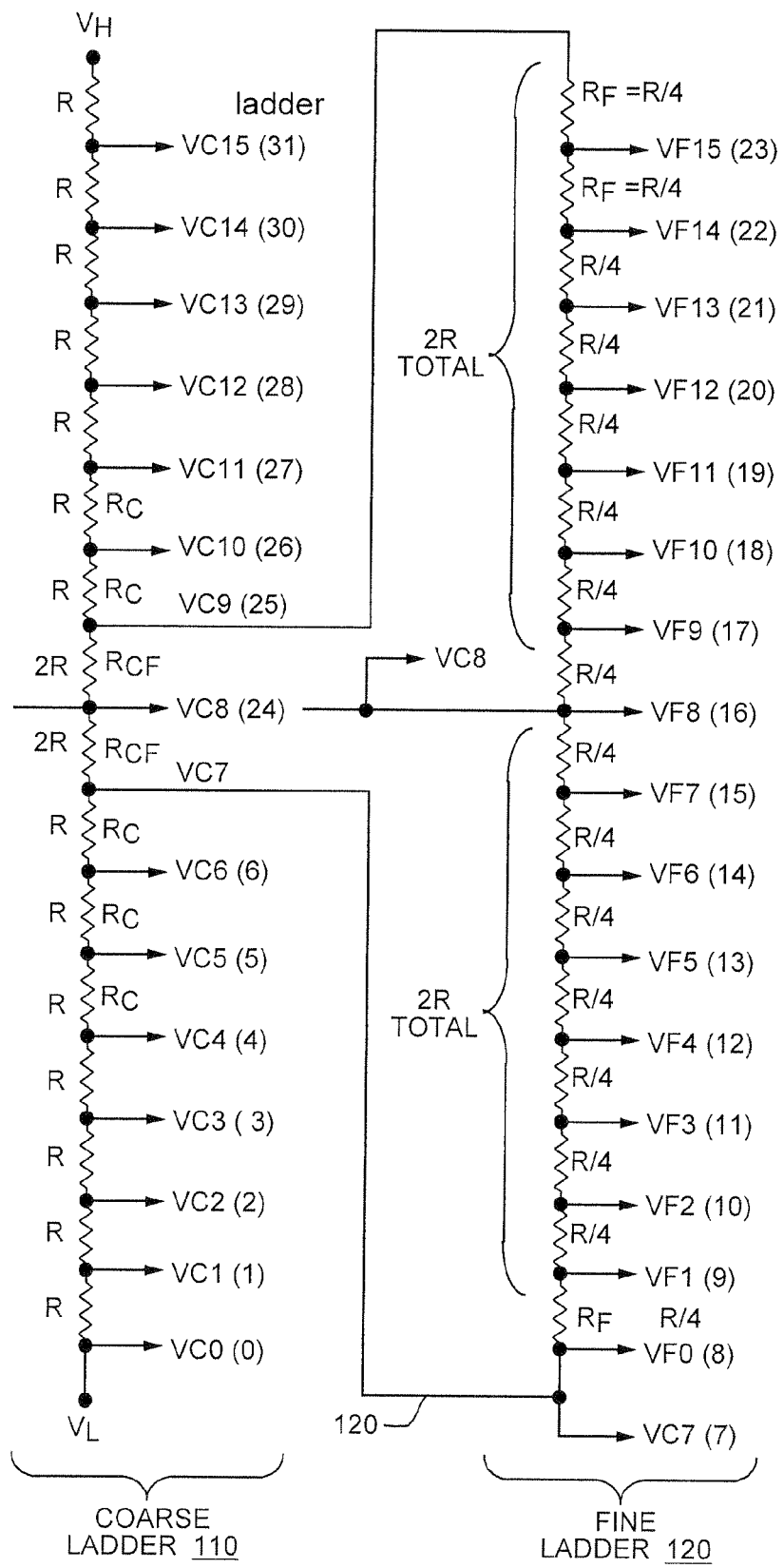
FIG. 5 shows one specific possible arrangement for the resistor ladder of FIG. 3 with both coarse and fine step resistors.

FIG. 5 illustrates that the ladder 50 may not consist of coarse resistances but may also have one or more fine resistor steps. The fine resistor steps allow for more precise control of the output voltages, by providing additional voltage steps between selected coarse steps. For example, a number of fine steps may be provided in the center portion of the ladder. As will be explained below, a different between a coarse and fine voltage can then be taken to give a fine voltage result.

More particularly, resistor ladder 50 consists of a coarse ladder portion 110 and a fine ladder portion 120. The coarse ladder portion 110 is provided by sixteen resistors 51 connected in series. Fourteen of the resistances are equal and have a resistance value, R, of 100 ohms. Two of the resistances in the coarse ladder are equal to 2R ohms; the purpose of this is to accommodate the fine ladder portion, as will be understood shortly.

The high reference voltage $V_h$ represents the largest possible selectable output voltage; $V_1$ represents the smallest possible selected output voltage. The coarse ladder of FIG. 5 thus provides 16 possible output voltages VC0, VC1, . . . VC15 spaced between $V_h$ and $V_1$.

The fine ladder portion 120 consists of 16 additional resistances, also arranged in series. The value of each of these fine resistances is R/4, or 25 ohms. These resistances provide 16 additional fine gradations. In the illustrated example, fine voltages VF0, VF1, . . . VF15 are provided ranging from VC7 to VC9.

A node just below VC7 in the coarse ladder is connected to node VC7 in the fine ladder; the node just below VC8 is connected to a node below VF8 in the middle of the fine ladder, and the node just below VC9 is connected to the node above VF15. Recall that the resistances in the coarse ladder 110 between VC7 and VC8 and between VC8 and VC9 were 2R (200 ohms). Thus, the arrangement of FIG. 5 provides 16 equally spaced fine gradation steps between VC7 and VC9.

The resistors values 2R and R/4 can be provided by two resistance devices, such as FETs in series, and four resistances R in parallel, respectively. This allows the very same device, having the same geometry, to be used to implement all components of each of the coarse and fine arrays. That same device thus exhibits the same behavior over a wide range of operating conditions, resulting in greater output voltage accuracy.

In the particular embodiment illustrated in FIG. 5, sixteen (16) resistance steps in the coarse ladder portion 110 provide 4 bits of output resolution. The fine ladder portion 120, also consisting of 16 resistance steps, spans two of the coarse steps in the middle of the range. This provides a total of 7 bits of effective resolution in the middle portion. It should be understood that in other embodiments, the arrangement of resistors could be different. For example, if the 16 fine steps were to span only one of the coarse steps, the fine output resolution would be 8 bits. A embodiment where at least 2 coarse steps are spanned assures that there are no gaps in the digital code ranges.

FIG. 6 is a table listing one possible range of the thirty-two (32) output voltages V0, V1, . . . , V31 available with the resistor ladder shown in FIG. 5. Here $V_h$, or the top of the ladder reference is set to 1.675 volts, and $V_1$ or the bottom of the ladder is set to 1.3 volts. The coarse portion 110 of the ladder 50 produces voltages V0 through V7 and V24 through V31, with coarse steps of 0.025 volts. The fine ladder 120 produces voltages from V8 through V23, with fine steps of 0.003125 volts. The ladder thus provides fine level adjustments in the middle of the $V_h$ to $V_1$ range centered around 1.5 volts (i.e., at V16).

Figure 7:
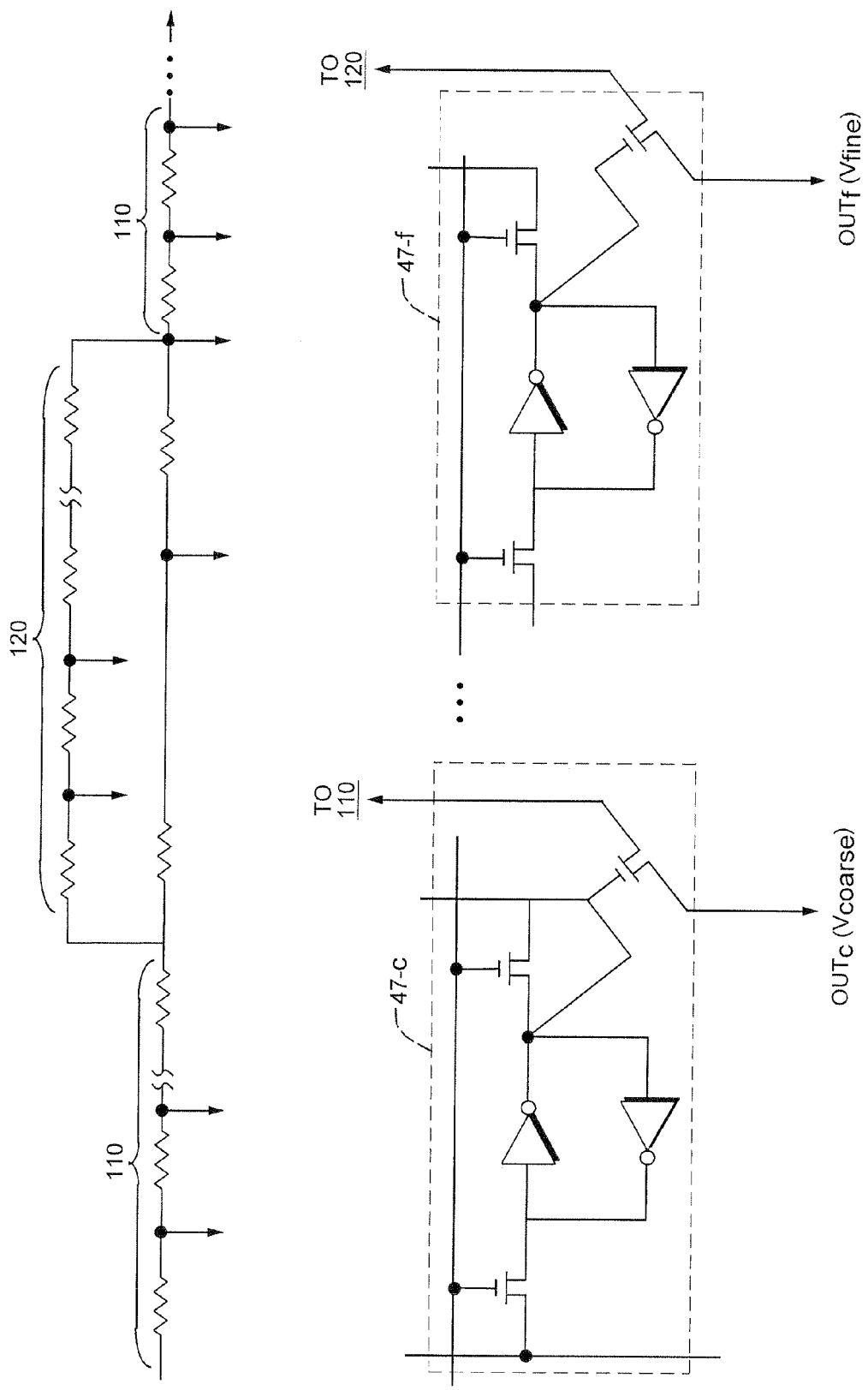
FIG. 7 illustrates another implementation of a VRAM cell providing a coarse and fine output voltage, to increase output resolution and improve noise immunity.

FIG. 7 shows an optional embodiment of the invention where cell outputs are combined. This permits generation of a voltage that is a difference between a two of the output voltages $OUT_1$, $OUT_2$, . . . , $OUT_m$. One of these output voltages, Vcoarse, is the output $OUT_c$ taken from a selected one of the VRAM cells 47-c that is connected to one of the nodes in the coarse portion 110 of the ladder 50. Another one of the output voltages, Vfine, is the output $OUT_f$ provided by a VRAM cell 47-f which is connected to select one of the nodes in the fine portion 120 of the ladder 50.

Figure 8:
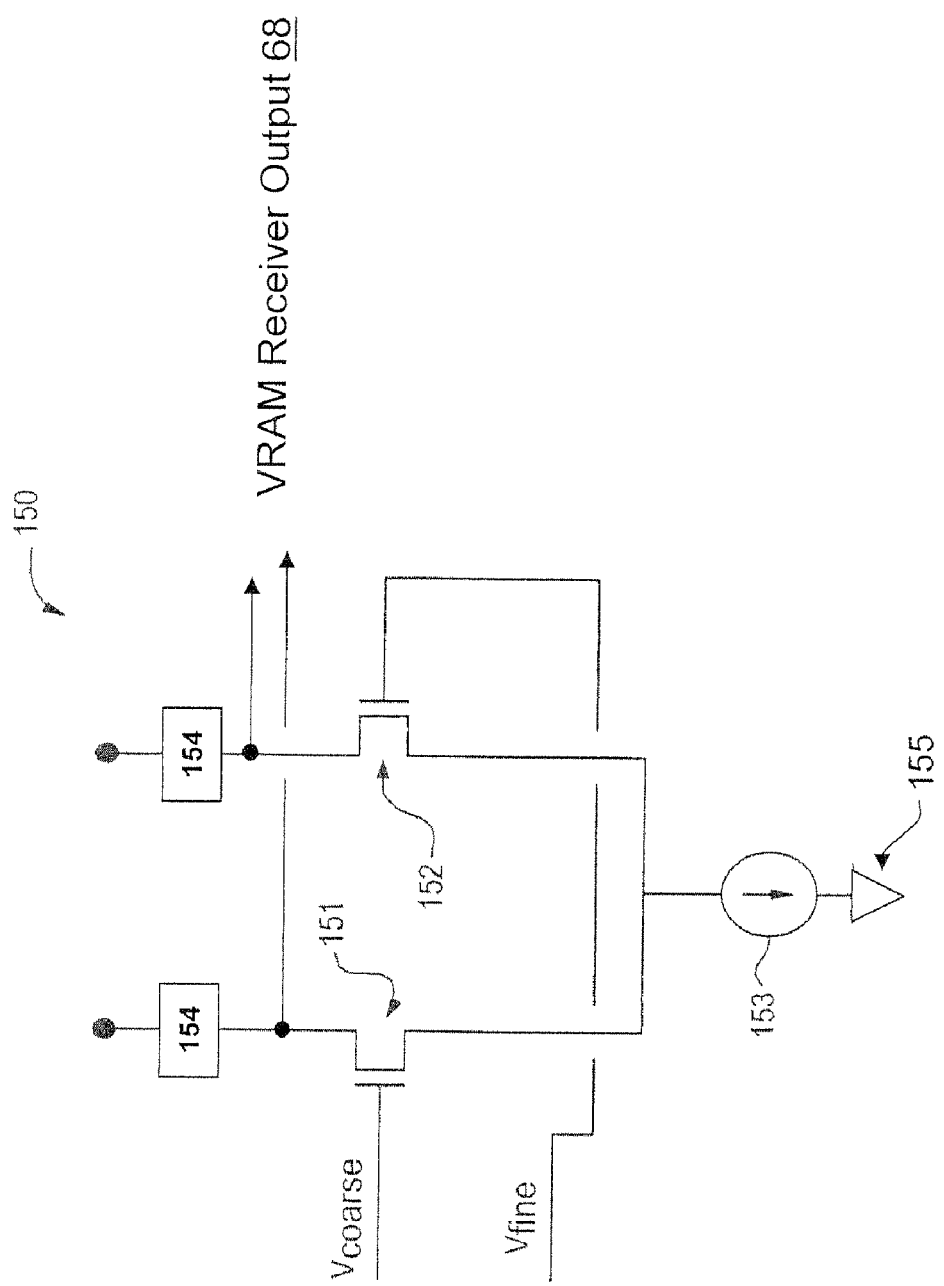
FIG. 8 is a VRAM receiver, that may be scattered throughout an IC design, that uses a difference amplifier to produce and output voltage that is proportional to a difference between a coarse voltage and a fine voltage.

The Vcoarse and Vfine output voltages are then fed to an output circuit 150 as shown in FIG. 8. The output circuit 150 is a pair of transistors 151, 152 and current source 153 to ground 155 arranged as a difference amplifier. The loads 154 convert the current difference to a voltage difference at the output 68.

The resulting output 68 is thus proportional to Vcoarse minus Vfine. This permits generation of a very small but still very accurate output voltage 68, such as 0.003125 volts, by selecting Vcoarse input from one of the cells to be V16 and the Vfine input from another cell at V17. The availability of such small voltages under program control can greatly improve the performance of circuits such as QDC shown in FIG. 1.

While this invention has been particularly shown and described with references to preferred embodiments thereof, it will be understood by those skilled in the art that various changes in form and details may be made therein without departing from the scope of the invention encompassed by the appended claims.

What is claimed is:

1. A method for causing a particular analog voltage to be output at an output node, the method comprising:
   providing a set of analog reference voltages at respective reference nodes;
   storing digital bits in an array of memory cells; and
   selectively coupling one or more of the analog reference voltages to the output node, the selective coupling of a given analog reference voltage depending upon a value of a respective one of the digital bits stored in a corresponding memory cell.

2. The method of claim 1 wherein the step of providing a set of analog reference voltages further comprises:
   providing the set of analog reference voltages at a respective plurality of reference nodes in a resistive voltage ladder.

3. The method of claim 1 wherein the step of selectively coupling further comprises:
   depending upon the value of the digital bits in a respective memory cell, controlling an open or closed state of a switch disposed between each reference node and the output node.

4. The method of claim 3 wherein the memory cells are arranged as an addressable array.

5. The method of claim 4 wherein the step of storing digital bits further comprises:
   addressing a selected memory cell; and
   storing a digital value in the memory cells in response to the addressing step, the digital value representative of desired states for the respective switches.

6. The method of claim 3 that further outputs a plurality of selectable analog output voltages comprising:
   controlling an open or closed state of two or more switches disposed between each reference node and a respective one of a plurality of output nodes; and
   coupling each of the plurality of output nodes to provide a respective one of the selectable analog output voltages.

7. The method of claim 2 wherein the resistive voltage ladder is further arranged as a first set of resistors connected in series to provide the set of reference analog voltages.

8. The method of claim 7 additionally wherein the resistive voltage ladder further comprises additional resistors arranged in parallel with one or more of the resistors in the first set to provide one or more fine reference analog voltages.

9. The method of claim 1 additionally comprising:
   storing, in a first memory cell, digital information to produce a coarse analog voltage;
   storing, in a second memory cell, digital information to produce a fine analog voltage; and
   producing, via a difference amplifier connected to receive the coarse analog voltage and the fine analog voltage, the analog output as a voltage or current proportional to a difference therebetween.

10. A method for converting charge to voltage in a serial pipeline register, comprising:
    comparing, at a first stage of the serial pipeline register, a voltage corresponding to charge of a charge packet against a first reference voltage provided by a first combination of nodes of a voltage ladder;
    transferring the charge packet from the first stage of the serial pipeline register to a second stage of the serial pipeline register;
    comparing, at the second stage, a voltage corresponding to charge of the charge packet against a second reference voltage, the second reference voltage provided by a second combination of nodes of the same voltage ladder used to generate the first reference voltage, and wherein the first and second combination of nodes used to generate the first and second reference voltages are each selected depending upon a value of a respective digital bit stored in a corresponding memory cell.

11. An apparatus that provides a particular analog voltage at an output node, the apparatus comprising:
    a set of reference nodes that provide a set of respective analog reference voltages;
    an array of memory cells that store digital bits; and
    a set of switches, for selectively coupling one or more of the analog reference voltages to the output node, the switches controlled by a respective one of the digital bits stored in a corresponding one of the memory cells.

12. The apparatus of claim 11 wherein the set of reference nodes further comprises a resistive voltage ladder.

13. The apparatus of claim 11 further comprising:
    a controller that, depending upon the value of the digital bits in a respective memory cell, controls an open or closed state of a switch disposed between each reference node and the output node.

14. The apparatus of claim 13 wherein the memory cells are arranged as an addressable array of memory cells.

15. The apparatus of claim 14 wherein the digital bits stored in the memory cells are representative of desired states for the respective switches.

16. The apparatus of claim 13 that additionally outputs a plurality of selectable analog output voltages, and the controller further controls an open or closed state of two or more switches disposed between each reference node and a respective one of a plurality of output nodes.

17. A apparatus as in claim 12 wherein the resistive voltage ladder is further arranged as a first set of resistors connected in series to provide the set of reference analog voltages.

18. A apparatus as in claim 17 additionally wherein the resistive voltage ladder further comprises additional resistors arranged in parallel with one or more of the resistors in the first set to provide one or more fine reference analog voltages.

19. An apparatus as in claim 11 additionally wherein
a first memory cell stores digital bits to produce a coarse analog voltage and a second memory cell stores digital bits to produce a fine analog voltage; and
a difference amplifier connected to receive the coarse analog voltage and the fine analog voltage produces the analog output.

20. A serial pipeline converter for converting charge to a voltage comprising:
a first stage of the serial pipeline register, connected to compare a voltage corresponding to charge of a charge packet against a first reference voltage provided by a first combination of nodes of a voltage ladder;
a charge transfer device, connected to transfer the charge packet from the first stage of the serial pipeline register to a second stage of the serial pipeline register;
the second stage connected to compare a voltage corresponding to charge of the charge packet against a second reference voltage, the second reference voltage provided by a second combination of nodes of the same voltage ladder used to generate the first reference voltage;
a plurality of memory cells; and
wherein the first and second combination of nodes used to generate the first and second reference voltages are each selected depending upon a value of a respective digital bit stored in a corresponding memory cell.

* * * * *

UNITED STATES PATENT AND TRADEMARK OFFICE
CERTIFICATE OF CORRECTION

PATENT NO. : 7,705,762 B2  Page 1 of 1
APPLICATION NO. : 12/332168
DATED : April 27, 2010
INVENTOR(S) : Michael P. Anthony and Lawrence J. Kushner It is certified that error appears in the above-identified patent and that said Letters Patent is hereby corrected as shown below:

On the Title Page in the Assignee Item (73)

"Wuborn" should be --Woburn--.

Signed and Sealed this

Second Day of November, 2010

David J. Kappos
*Director of the United States Patent and Trademark Office*